(12) United States Patent
Chang (10) Patent No.: US 9,602,314 B1
(45) Date of Patent: Mar. 21, 2017

(54) COMMUNICATIONS RECEIVER EQUALIZER

(71) Applicant: Freescale Semiconductor, Inc., Austin, TX (US)

(72) Inventor: Kevin Yi Cheng Chang, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/040,344

(22) Filed: Feb. 10, 2016

(51) Int. Cl.
*H04L 25/03* (2006.01)
*H03K 5/134* (2014.01)
*H03K 5/00* (2006.01)

(52) U.S. Cl.
CPC ....... *H04L 25/03019* (2013.01); *H03K 5/134* (2014.07); *H03K 2005/00019* (2013.01)

(58) Field of Classification Search
USPC .................................. 375/232, 362; 455/307
See application file for complete search history.

(56) References Cited

U.S. PATENT DOCUMENTS

| | | | |
|---|---|---|---|
| 6,650,182 B2 | 11/2003 | Kim et al. | |
| 7,302,461 B2 | 11/2007 | Mukherjee et al. | |
| 7,598,788 B2 | 10/2009 | Cao | |
| 7,760,012 B1 | 7/2010 | Opris | |
| 8,117,249 B1 | 2/2012 | Mukherjee et al. | |

OTHER PUBLICATIONS

Mammei et al., "A Power-Scalable 7-Tap FIR Equalizer with Tunable Active Delay Line for 10-to-25Gb/s Multi-Mode Fiber EDC in 28nm LP-CMOS," 2014 IEEE International Solid-State Circuits Conference, Session 8, Feb. 11, 2014, 3 pages.
Douillard et al., "Iterative correction of intersymbol interference: turbo-equalization," European Transactions on Telecommunications, Wiley, 1995, 6 (5), pp. 507-512.
Wu et al., "Integrated Transversal Equalizers in High-Speed Fiber-Optic Systems," IEEE Journal of Solid-State Circuits, vol. 38, No. 12, Dec. 2003, pp. 2131-2137.

(Continued)

*Primary Examiner* — Eva Puente (57) ABSTRACT

A continuous-time linear equalizer implementing enhanced analog delay cells with gain-peaking characteristics and a constant delay time. A receiver feed-forward equalizer architecture implements a gain-stage chain, analog multipliers for correcting coefficients, and a linear combiner as an analog summation circuit. Each of the gain stages produces linear gain peaking and presents a constant delay-time (through calibrations) at each stage. Each delay cell includes a transconductance stage configured to convert a differential input voltage signal to a differential output current signal, wherein the transconductance stage includes a differential pair of first and second transistors coupled in a source degeneration configuration, a negative resistance network coupled in parallel with a tunable resistor network, and shunt inductive circuitry coupled in parallel with the negative resistance network. The delay cells also include a transimpedance stage configured to convert the differential output current signal received from the transconductance stage to a differential output voltage signal, wherein the transimpedance stage implements a first transimpedance amplifier coupled in series with a first shunt inductive circuit. The shunt inductive circuits may include inductorless inductor circuit elements.

20 Claims, 7 Drawing Sheets

(56) References Cited

OTHER PUBLICATIONS

H. Fu, "Equalization for High-Speed Serial Interfaces in Xilinx 7 Series FPGA Transceivers," 7 Series Transceiver Emphasis/Equalization Overview, Mar. 27, 2012, 18 pages.
Hao et al., "A low power CMOS 3.3 Gbps continuous-time adaptive equalizer for serial link," Journal of Semiconductors, vol. 32, No. 9, Sep. 2011, pp. 095001-1-095001-8.
C. Langton, "Inter Symbol Interference (ISI) and Raised Cosine Filtering," Intuitive Guide to Principles of Communications, available at www.complextoreal.com, 2002, 23 pages.
Ren et al., "Precursor ISI Reduction in High-Speed I/O," 2007 Symposium on VLSI Circuits Digest of Technical Papers, Jun. 14-16, 2007, pp. 134-135.
E. Lee, "High-Speed Serial Data Link Design and Simulation," Thesis: Submitted in partial fulfillment of the requirements for the Master of Science in Electrical and Computer Engineering in the Graduate College of the University of Illinois at Urbana-Champaign, 2009, 27 pages.
Lin et al., "A 2.5- to 3.5-Gb/s Adaptive FIR Equalizer With Continuous-Time Wide Bandwidth Delay Line in 025-μm CMOS," IEEE Journal of Solid-State Circuits, vol. 41, No. 8, Aug. 2006, pp. 1908-1918.
Ferreira et al., "A 60-dB Gain OTA Operating at 0.25-V Power Supply in 130-nm Digital CMOS Process," IEEE Transactions on Circuits and Systems-I: Regular Papers, vol. 61, No. 6, Jan. 2, 2014, pp. 1609-1617.
Freescale Semiconductor, Inc., "SerDes Configuration and Validation Tool Companion," Document No. AN5119, Rev. 1, Jun. 2015, 25 pages.
"FIR Filters," Chapter 5, ECE 2610 Signal and Systems, Mar. 7, 2011, pp. 5-1-5-38, available at http://www.eas.uccs.edu/~mwickert/ece2610/.

COMMUNICATIONS RECEIVER EQUALIZER

FIELD

The present invention relates in general to the field of communications devices, and more particularly, to a receiver feed-forward equalizer with continuous-time delay cells with linear equalizing capacity.

BACKGROUND

Inter-symbol interference ("ISI") is an unavoidable consequence of both wired and wireless communications systems. The ones and zero bits of a data stream are converted into an analog signal (thus becoming the "symbols") for the transmission over a transmission link (also referred to herein as a "communications channel"). Because of the various properties of the medium (of the communications channel) used and the distance of signal travel (through the communications channel), the symbols of the received signal tend to become elongated and smeared into each other. This spreading and smearing of symbols, such that the energy from one symbol affects the next ones in such a way that the received signal has a higher probability of being incorrectly interpreted, is referred to as inter-symbol interference. ISI can be caused by many different reasons, such as filtering effects from hardware or frequency selective fading, from nonlinearities, and from charging effects.

Correspondingly, ISI is a fundamental problem in digital communications in bandwidth-limited links. If the ISI is severe, the received signal quality is poor, and the clock and data recovery circuits tend to fail together.

Take an example of digital data transmitted via a serial communications channel between components within a data processing system. The transmitter on one of the components will serialize the data and send serial differential pair signals by first converting the digital data to an analog signal for sending across the communications channel (the path between the transmitter and receiver, e.g., electrical components, printed circuit board, conductive traces, cables, and so on) to the receiver at the other component within the data processing system. It is the job of the receiver to collect the analog signal, extract a clock from the signal, and de-serialize and digitize the signal. Consider a single pulse (e.g., representing 1 bit) within the transmitted digital data. It starts out at the transmitter as a definite single pulse; however, by traversing the "lossy" channel, it develops "tails" (cursors) on either side of the received pulse. These tails may be caused by losses in the channel resulting from its own inherent resistance of the electrical path, and/or the mismatches between the impedance of the transmitter and receiver ends and the impedance of the channel, which can cause a reflection of a portion of the transmitted signal.

If the communications channel comprises a multimode fiber optic cable, the ISI is the dominant power penalty in the channel power budget and effectively sets the limits for the achievable data rate or transmission distance of the channel, due to the fact that it increases exponentially with the distance and thus, dominates the other penalties in the link power budget. A primary source of ISI in a fiber optic system is signal pulse broadening due to fiber dispersion. There are three types of dispersion in a fiber optic system: modal dispersion, chromatic dispersion, and polarization-mode dispersion. In a multimode fiber, different mode groups have different velocities, which are referred to as modal dispersion. Chromatic dispersion is due to the fact that different wavelengths of light have different velocities.

DETAILED DESCRIPTION

As a result of the foregoing, transmit and/or receive equalization may be provided to compensate for losses associated with the analog signal being transmitted through the communications channel. In a communications system, equalization is the process of correcting the channel induced distortion resulting from the inherent losses within the communications channel (i.e., the aforementioned inherent ISI characteristics of the communications channel). An equalizer is a filter that can be adjusted to compensate for the distortion of the channel. Because a communications channel essentially operates as a low pass filter, the equalizers function to equalize the levels between the various frequencies of the transmitted signal. In some respects, such an equalizer operates as a high-pass filter. The essential issue is that the eye pattern of the received signal (i.e., an oscilloscope display of the received signal that can provide an indication of the effects of channel noise and/or ISI) is closed to some extent, which may lead to inaccurate processing of the receiver and therefore, increases the bit error ratio ("BER") of the overall system. Therefore, an equalizer may be utilized for the receiver to achieve a specified BER.

Aspects of the present disclosure provide for a continuous-time linear equalizer ("CTLE") implementing enhanced analog delay cells with CTLE gain-peaking characteristics and a constant delay time. A receiver feed-forward equalizer architecture disclosed within aspects of the present disclosure comprise a CTLE gain-stage chain, analog multipliers for correcting coefficients, and a linear combiner as an analog summation circuit. Each of the CTLE gain stages produces linear gain peaking and presents a constant delay-time (through calibrations) at each stage.

In a high-speed serial transmission system, equalizers may be used in receivers to counter the distortion introduced to signals of the transmitted signal as they travel from a transmitter through a channel to a receiver. Since the channel operates similar to a low pass filter, as discussed above, the equalizer(s) operate to counter the channel by attenuating the low frequency components and boosting the high frequency components. Although exemplary embodiments are described herein in which the communications channel is an electrical conductor transmitting electrical signals, embodiments of the present invention are applicable to other transmission mediums, such as wireless and fiber optic.

Figure 1:
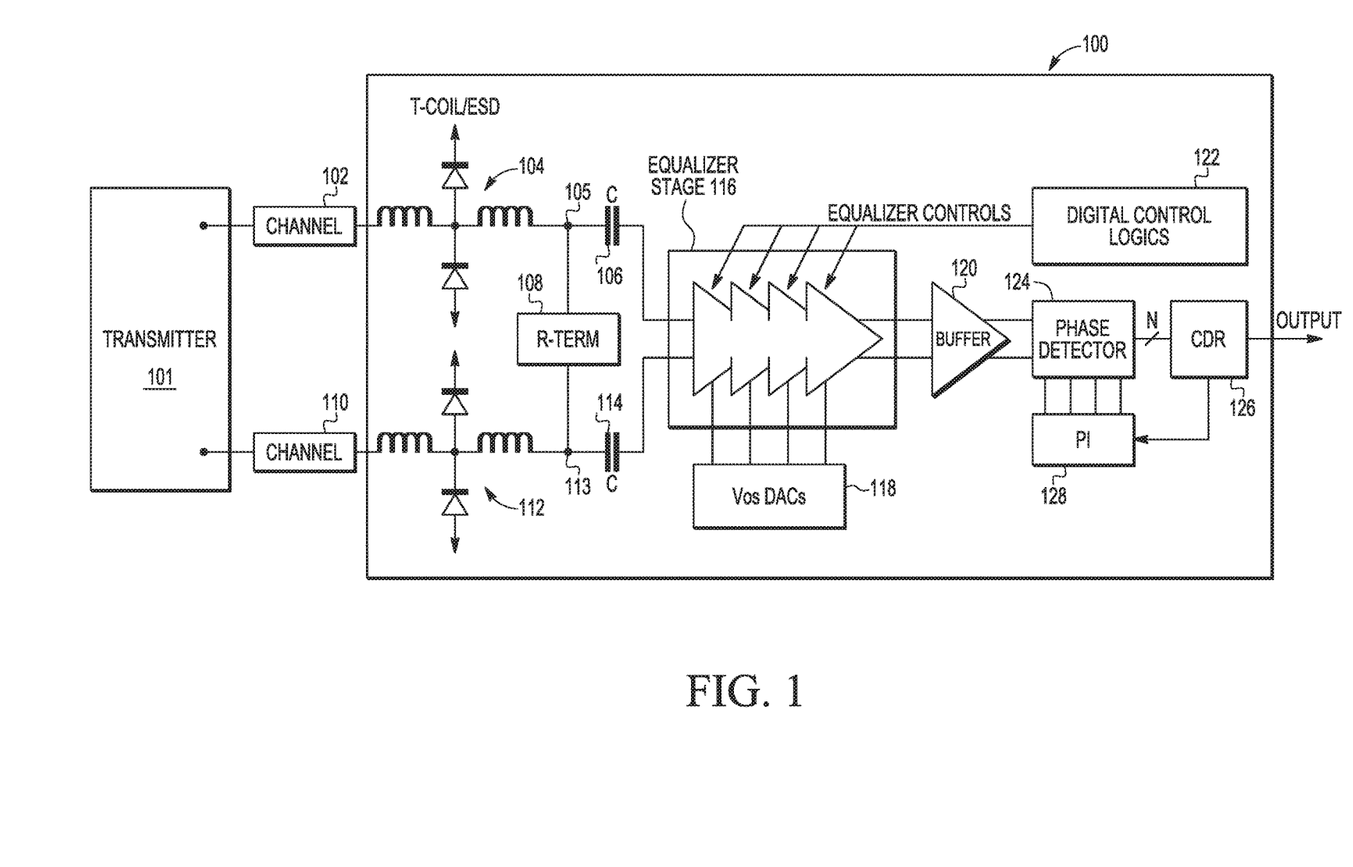
FIG. 1 illustrates a block diagram of a communications system for a data processing system configured in accordance with embodiments of the present invention.

FIG. 1 illustrates, in block diagram form, a receiver 100 which may be used in a high-speed serial transmission system in accordance with embodiments of the present invention. A transmitter 101 transmits electrical signals over the differential channels 102 and 110. After the channels 102 and 110, the electrical signals may pass through the Bridge-T networks 104 and 112, respectively, each including two mutual inductors, which are used for improved impedance matching and reduction of input return-loss. Also included with each of the Bridge-T networks 104 and 112 may be diodes for electrostatic discharge ("ESD") protection. After the Bridge-T networks 104 and 112, the signals may be transmitted through the capacitors 106 and 114, which operate as alternating current ("AC") coupling capacitors, to input nodes of the equalizer stage(s) 116. A resistive terminal network ("R-Term") 108 may be coupled between a circuit node 105 (located between the Bridge-T network 104 and the capacitor 106) and a circuit node 113 (located between the Bridge-T network 112 and the capacitor 114). The R-Term network 108 can be utilized to provide a self-calibrated input impedance. For example, it may provide a self-calibrated 100 ohm differential input impedance.

The linear equalizer stage(s) 116 include any number (e.g., one or more) of equalizers. The equalizer stage(s) 116 may receive equalizer controls from the digital control logics 122. The equalizer controls may operate onto the source-degenerative resistors and capacitors (not shown) of any implemented active gain stages. The control of the active equalizer stage(s) 116 may be utilized to produce an adequate gain ratio of the high frequency gain to the low frequency gain in order to compensate the loss of the received signal over different frequency regions. The equalizer stage(s) 116 also may be coupled to offset voltage correcting digital-to-analog converters ("DACs") 118. The offset voltage correcting DACs 118 may provide two DC levels at the differential input ports of each equalizer stage so that the offset voltage present at the final equalizer output can be eliminated. The equalizer stage(s) 116 operate to counter the adverse effects on the electrical signals by the channels by attenuating the low frequency components and boosting the high frequency components of the electrical signals. The equalizer stage(s) 116 therefore improve the signal quality and reduce the jitter of the eye diagram of the transmitted signal through the channels 102 and 110.

The output of the equalizer stage(s) 116 may be provided to a buffer 120. The output of the buffer 120 may be provided to a phase detector 124, which determines phase differences between the output of the buffer 120 and the receiver sampling clocks given by the phase interpolator ("PI") 128. The phase detector 124 decodes the phase error and provides an N-bit data bus to the clock and data recovery ("CDR") circuit 126, which provides feedback to the PI 128. The PI 128 is coupled to the phase detectors 124, and is used to generate signal phase shifts in discrete increment steps. The PI 128 sends in-phase and quadrature clocks, which are 90 degrees out of phase, to sample the data signal at the phase detector 124. When the CDR 126 settles to a steady state, the in-phase PI clock will be lined up to the center of the data signal, and the quadrature PI clock is present at the transition-edge of the data signal.

Figure 2:
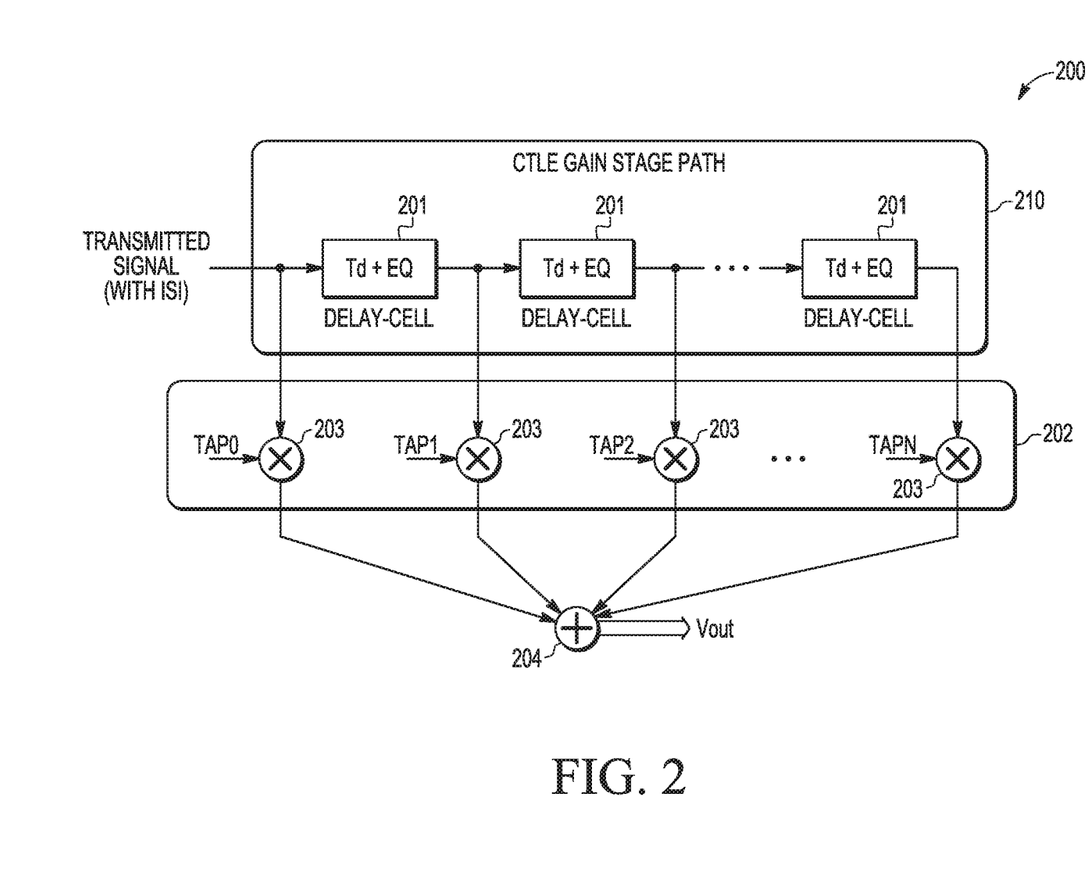
FIG. 2 illustrates a block diagram of an equalizer configured in accordance with embodiments of the present invention.

FIG. 2 illustrates, in block diagram form, an equalizer 200 configured in accordance with embodiments of the present invention. This equalizer 200 may be implemented within the equalizer stages 116 of the receiver 100 in combination with other equalizer circuits, or as the sole equalizer. The equalizer 200 implements a finite impulse response ("FIR") structure with taps on a CTLE gain-stage path 210. In other words, the analog delay cells 201 have linear gain-peaking characteristics and present a constant time delay (through calibrations) at each stage 201 (i.e., each delay cell 201 adds an additional phase shift to the signal). Additionally, each of the delay cells 201 implements, as will be further described with respect to FIG. 4, source-degeneration impedance combination with (−R∥Rs)∥(Ls) for a large transconductance generation without requiring a high power consumption. Furthermore, the delay cells 201 are "inductorless" (meaning that they are implemented in an integrated circuit with circuitry other than what has been traditionally used to form an inductor (e.g., using metallization lines formed in the shape of a spiral)) implementing parallel source-degenerative active inductive blocks and a negative-resistance network. With such inductorless delay cells, the chip area needed for implementing the receiver 100 can be greatly reduced.

The equalizer 200 receives the transmitted signal with its inherent ISI characteristics. This transmitted signal is received by a first of N (where N is greater than or equal to 1) delay cells 201 within the CTLE gain-stage path 210, and by a first tap multiplier 203 of the N+1 (where N is greater than or equal to 1) taps 202. The number N of delay cells may be determined by the desired design of the equalizer. For example, N may be determined by the number of bits of ISI the equalizer is intended to cancel. The output of each delay cell 201 is received by its corresponding Nth tap multiplier 203. Each of the N+1 taps 200 may implement an analog multiplier for correcting coefficients. Each of the taps 203 multiplies its received signal by an equalization coefficient (i.e., Tap0 . . . TapN). The coefficients (i.e., Tap0 . . . TapN) for each of the N+1 taps 203 may be adjusted based on decision results using an adaptive algorithm, such as a least mean square or zero-forcing algorithm. The outputs of the N−1 delay cells 201 are sent to the next delay cell 201 within the CTLE gain-stage path 210. The outputs of the taps 203 are received by the summation circuit 204, which may be a linear combiner operating as an analog summation circuit, which sums the outputs of the taps 203 generating an equalized output signal Vout. This output signal Vout may be delivered to the next equalizer stage 116, or to the output circuitry of a receiver, such as the buffer 120 in the receiver 100. The correcting coefficients for Tap0 through TapN may be generated based on a least-mean-square ("LMS") algorithm Thus, the new Taps can be updated and expressed as follows:

$$\text{Tap0}((K+1)\cdot T_s) = \text{Tap0}(K\cdot T_s) + 2u0 * \text{Err}(K\cdot T_s) * Xin0(K\cdot T_s)$$

$$\text{Tap1}((K+1)\cdot T_s) = \text{Tap1}(K\cdot T_s) + 2u1 * \text{Err}(K\cdot T_s) * Xin1(K\cdot T_s)$$

. . .

$$\text{Tap}N((K+1)\cdot T_s) = \text{Tap}N(K\cdot T_s) + 2uN * \text{Err}(K\cdot T_s) * XinN(K\cdot T_s),$$

where $T_s$ is the sample time in the discrete-time system, u0, u1 . . . uN are the weighted parameters, and $\text{Err}(K\cdot T_s)$ is the error value at the moment of the time, $K\cdot T_s$. The Xin0, Xin1 . . . XinN are the inputs of the delay cells corresponding to Tap0, Tap1 . . . TapN. The implementation of this LMS block can be incorporated into the digital control logics 122 in FIG. 1.

Figure 3:
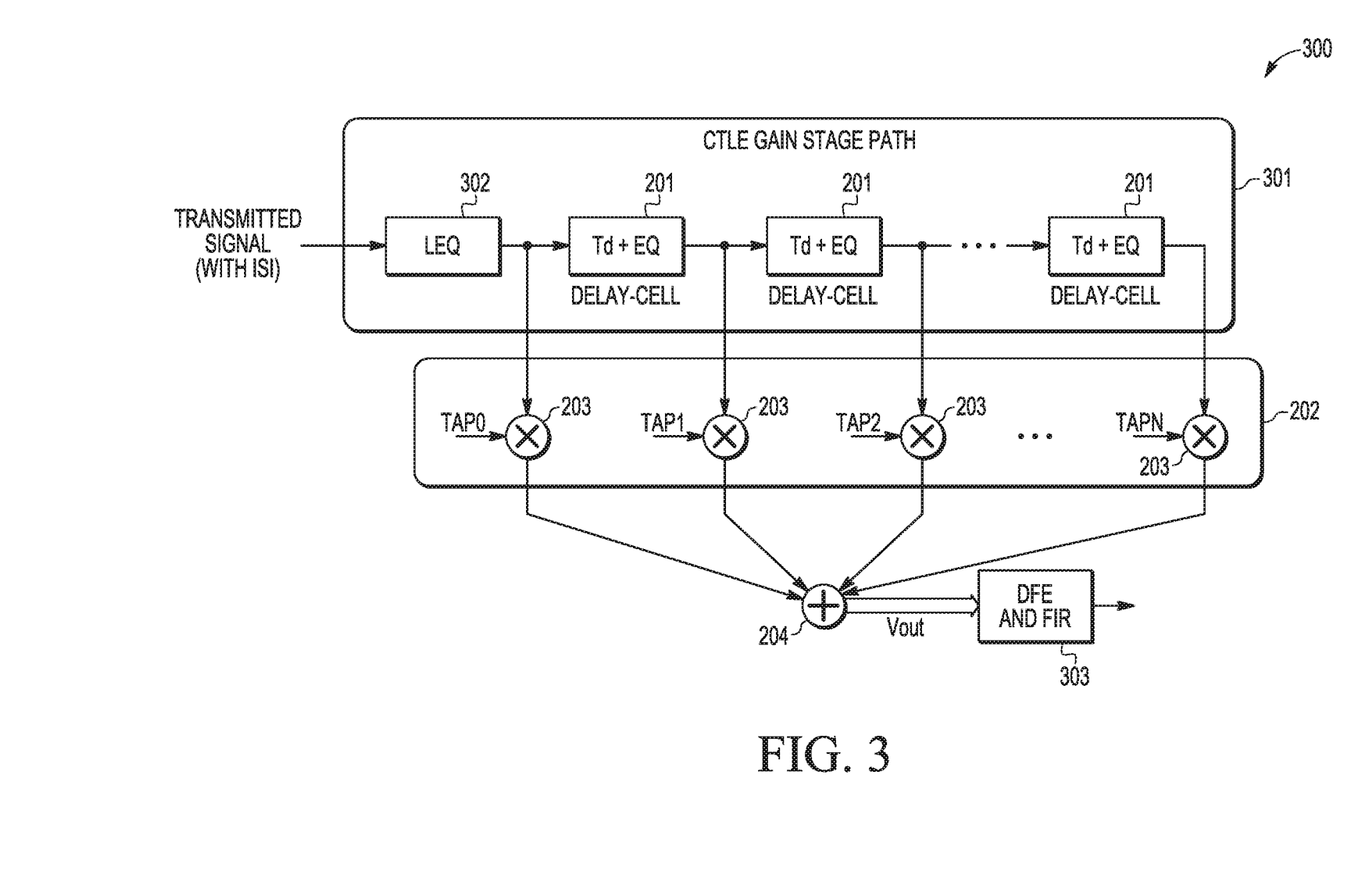
FIG. 3 illustrates a block diagram of an implementation of a plurality of equalizer stages configured in accordance with embodiments of the present invention.

FIG. 3 illustrates an alternative embodiment of an equalizer 300, which may be utilized within the equalizer stages 116 of the receiver 100. The equalizer 300 is similar to the equalizer 200, except that its CTLE gain stage path 301 includes a pre-filter linear equalizer ("LEQ") 302 receiving the transmitted data with the inherent ISI characteristics, and then operating on this signal and sending its output to the chain of delay cells 201 and the initial $0^{th}$ tap 203 within the series of N+1 taps 202. For example, the LEQ 302 may operate on the input signal to provide a maximum and tunable gain ratio for AC-Gain/DC-Gain (i.e., the gain ratio of the high frequency peaking gain to the low frequency gain) of the signal.

The delay cells 201 and taps 203 may each operate in a similar manner as previously disclosed with respect to FIG. 2. Furthermore, the equalizer 300 may implement further equalizer stages 303, which receive the output Vout from the summation circuit 204 before sending their output to the output circuitry of the receiver, such as the buffer 120 of the receiver 100. The equalizer stages 303 may employ a combination of a decision feedback equalizer ("DFE") and finite-impulse response ("FIR") filter. Note that any other suitable equalizers may be implemented instead of the LEQ 302 and equalizer stages 303 for utilization in combination with the equalizer 200.

Figure 4:
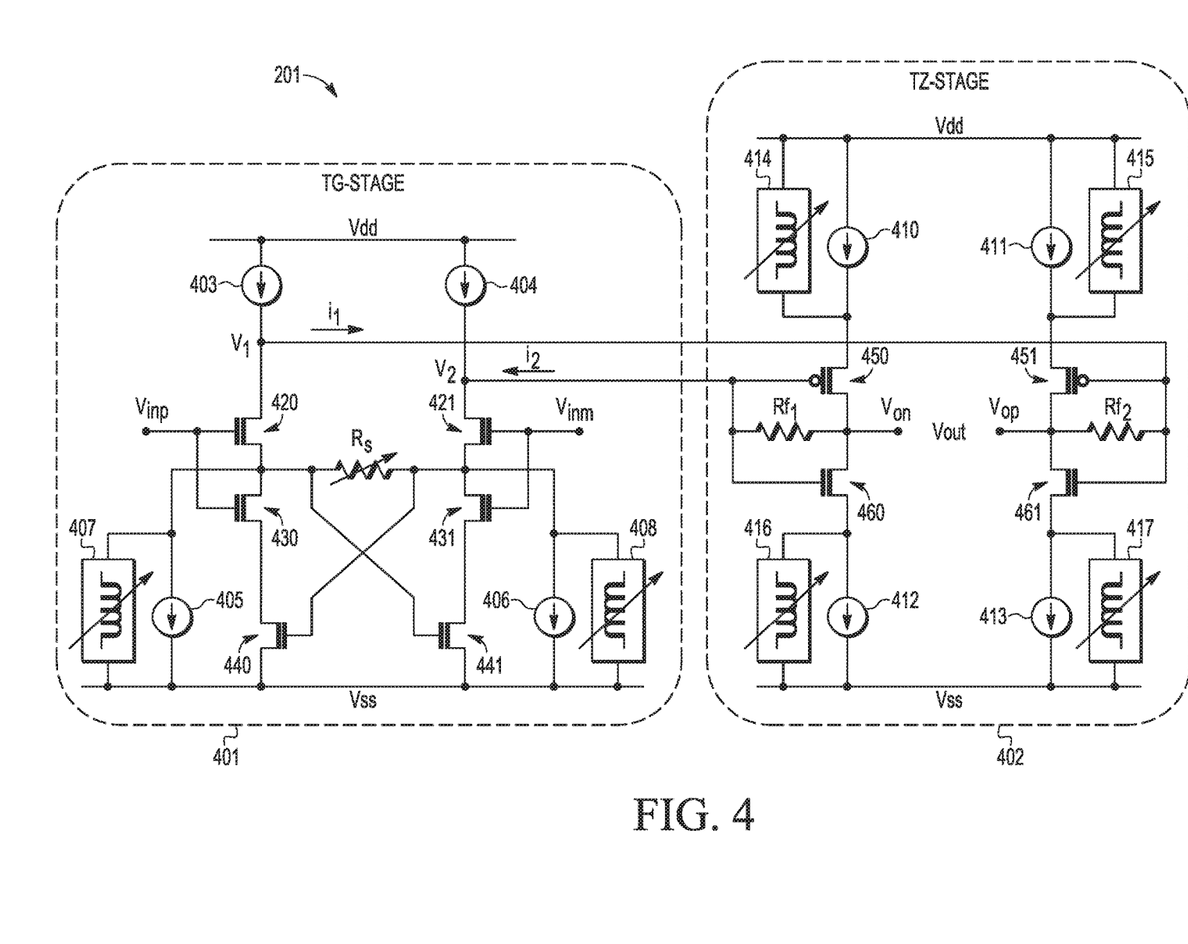
FIG. 4 illustrates a schematic of a delay cell utilized within embodiments of the present invention.

FIG. 4 illustrates a circuit diagram representing each of the delay cells 201, which may be implemented within embodiments of the present invention, such as within equalizers 200 and 300. A delay cell 201 comprises a transconductance stage ("TG-Stage") 401 coupled to a transimpedance stage ("TZ-Stage") 402. The TG-Stage 401 is a "voltage-input" and "current-output" circuit (thus, a voltage-to-current converter), while the TZ-Stage 402 is a "current-input" and "voltage-output" circuit (thus, a current-to-voltage converter). This configuration of TG-TZ stages produces a greater gain and bandwidth for high frequency applications than prior art voltage amplifier stages, which are "voltage-input" and "voltage-output" in nature. Such prior art voltage amplifiers have limitations, since their bandwidth is dominated by the intrinsic RC time-constants of their output, while the TG-TZ stage configuration of embodiments of the present invention is less sensitive to their output RC time-constants.

The TG-Stage 401 receives a differential input voltage, $V_{in}$, at its input nodes $V_{inp}$ and $V_{inm}$ (i.e., $V_{in}=V_{inp}-V_{inm}$). Such differential voltages may be received from the transmitted signal or a previous delay cell 201 as shown with respect to the equalizer 200, or from a previous equalizer stage (e.g., LEQ 302) or a previous delay cell 201 as shown with respect to equalizer 300. The differential output voltage, $V_{out}$, from each delay cell 201 is provided at the differential output nodes $V_{on}$ and $V_{op}$ of the TZ-Stage 402 (i.e., $V_{out}=V_{op}-V_{on}$). These output voltages may be provided to a next delay cell 201 and one of the N taps 203 multiplier, as shown with respect to the equalizers 200 and 300, except for the last delay cell 201 within the delay stage paths, in which the output voltages are merely provided to the Nth tap 203 multiplier.

The TG-Stage 401 implements a tunable negative source-degeneration scheme and shunt current-controlled inductors. A current source 403 is coupled between the supply voltage Vdd and transistor 420, which receives one of the differential voltage input signals at its gate electrode tied to the input $V_{inp}$. The TG-Stage 401 implements a tunable negative source-degeneration scheme and shunt current-controlled inductors. A current source 404 is coupled between the supply voltage Vdd and transistor 421, which receives one of the differential voltage input signals at its gate electrode tied to the input $V_{inm}$. The differential output voltage $V_1$ is coupled between the current source 403 and the transistor 420, while the differential voltage output node $V_2$ is coupled between the current source 404 and the transistor 421.

As shown in FIG. 4, transistors 430, 431, 440, and 441 are cross coupled to each other between the nodes 420, 421 and the supply voltage Vss. Note that within embodiments of the present invention, the supply voltage Vdd may be have a positive voltage value, while the supply voltage Vss may have a negative voltage value, or may be tied to a ground potential. The gate electrode of the transistor 430 is coupled to the differential voltage input $V_{inp}$, while the gate electrode of the transistor 431 is coupled to the differential voltage input $V_{inm}$. Within embodiments of the present invention, the transistors 420, 421, 430, 431, 440, and 441 may all comprise NMOS transistors. The transistors 440 and 441 are cross-coupled to each other to provide a negative resistance ("−R") network across the nodes 420 and 421.

The transistors 430 and 431 are utilized to provide a feed-forward effect on the negative resistance behaviors across the nodes 420 and 421. A tunable (variable) resistor network $R_s$ is in parallel to the cross-coupled negative resistance network to adjust the effective negative resistance of the TG-Stage 401. The tunable resistor network $R_s$ may be implemented in any manner suitable for providing a variable resistance value for $R_s$. For example, a plurality of series-coupled resistor elements combined with switching elements (e.g., NMOS transistors) may be implemented so that a received control signal activates/deactivates one or more of the switching elements in order to determine how many of the resistor elements are placed in series between the nodes 420 and 421. Such a received control signal may be configured to be provided by the digital control logics 122 of the receiver 100 (see FIG. 1).

Shunt inductive circuitry is incorporated in the TG-Stage 401 to generate an all-pass transfer function response with a RHP (right half plane) zero and a LHP (left half plane) pole. The shunt inductive circuitry comprises a current source 405 and an inductor circuit 407 coupled in parallel between the node 420 and the supply voltage Vss, and a current source 406 and an inductor circuit 408 coupled in parallel between the node 421 and the supply voltage Vss.

The TZ-Stage 402 implements a pair of single-ended low input-impedance circuits as the loads of the TG-Stage 401.

Within the TZ-Stage 402, a first shunt inductive circuit comprising a current source 410 coupled in parallel with the inductor circuit 414 is coupled between the supply voltage Vdd and the transistor 450. A second shunt inductive circuit comprising a current source 411 coupled in parallel with the inductor circuit 415 is coupled between the supply voltage Vdd and the transistor 451. A third shunt inductive circuit comprising a current source 412 coupled in parallel with the inductor circuit 416 is coupled between the supply voltage Vss and the transistor 460. And, a fourth shunt inductive circuit comprising a current source 413 coupled in parallel with an inductor circuit 417 is coupled between the supply voltage Vss and the transistor 461. The shunt inductive circuits are used to produce a second RHP zero for gain peaking and further phase shift.

The gate electrodes of the complementary transistors 450 and 460 are coupled to the node $V_2$ of the TG-Stage 401. The gate electrodes of the complementary transistors 451 and 461 are coupled to the output node $V_1$ of the TG-Stage 401. The differential output $V_{out}$ of the TZ-Stage 402, which is the differential voltage output of each delay cell 201, is received from the differential output nodes $V_{on}$ and $V_{op}$.

Output node $V_{on}$ is coupled between the transistors 450 and 460. The differential voltage output node $V_{op}$ is coupled between the transistors 451 and 461.

A first feedback resistor $Rf_1$ is coupled between the differential voltage output node $V_{on}$ and the gate electrode of the PMOS transistor 450 to form a transimpedance amplifier comprising a P-type feedback amplifier. The first feedback resistor $Rf_1$ and the NMOS transistor 460 form a transimpedance amplifier comprising an N-type feedback amplifier. A second feedback resistor $Rf_2$ is coupled between the differential voltage output node $V_{op}$ and the gate electrode of the PMOS transistor 451 to form a transimpedance amplifier comprising a P-type feedback amplifier. The second feedback resistor $Rf_2$ and the NMOS transistor 461 form a transimpedance amplifier comprising an N-type feedback amplifier.

Within embodiments of the present invention, the current sources 403, 404, 410, and 411 may each be implemented with a PMOS transistor with its control electrode receiving a constant voltage, such as a DC bias voltage; the current sources 405, 406, 412, and 413 may each be implemented with an NMOS transistor with its control electrode receiving a constant voltage, such as a DC bias voltage.

Figure 6:
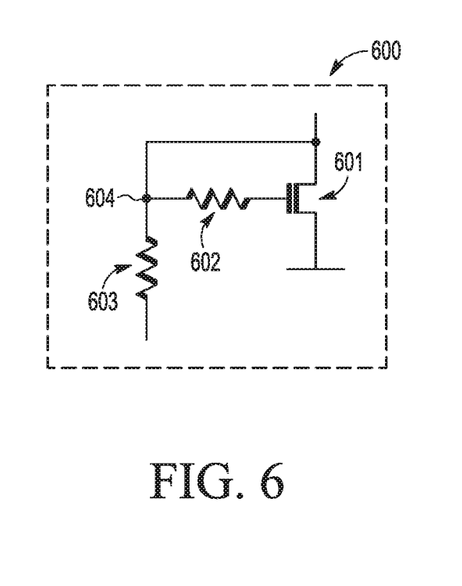
FIG. 6 illustrates a diagram of a circuit for emulating inductors within the delay cell of FIG. 4.

A tunable bias voltage, $V_{bs}$, with source-resistance, may be used to change the bias conditions within the inductor circuits 407, 408, and 414-417 as further described with respect to FIG. 6.

Figure 5:
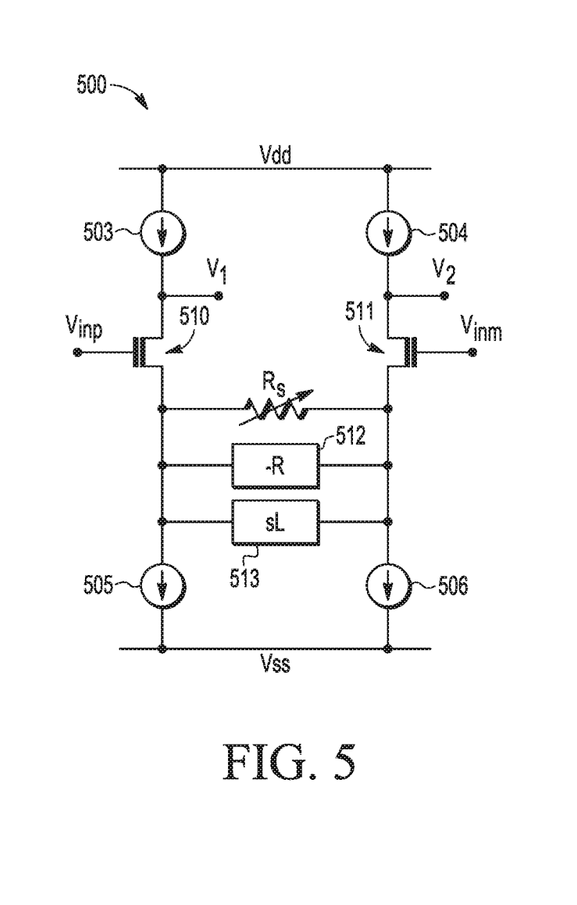
FIG. 5 illustrates an equivalent circuit diagram of the transconductance stage of the delay cell of FIG. 4.

FIG. 5 illustrates a diagram of an equivalent circuit 500 representation of the TG-Stage 401. For purposes of the following explanation, current sources 503 and 504 may be considered equivalent to current sources 403 and 404, respectively, while transistors 510 and 511 may be considered equivalent to the transistors 420 and 421, respectively. Within the equivalent circuit 500, the tunable resistor $R_s$, the negative resistance network ("-R") 512, the inductor impedance ("sL") 513, and the current sources 505, 506 may be considered equivalent to the circuitry within the TG-Stage 401 comprising the tunable resistor $R_s$, the transistors 430, 431, 440, 441, the current sources 405 and 406, and the inductor circuits 407 and 408. The inductance with the impedance sL is used to generate a desired transfer function for the delay cell 201. Utilizing this equivalent circuit 500, the impedance $Z_s$ for the circuit 500 is provided in the following Equation (1):

$$Z_s = \frac{\left(\frac{-R_s \cdot R}{R_s - R}\right) \cdot (s \cdot L)}{\left(\frac{-R_s \cdot R}{R_s - R}\right) + (s \cdot L)}$$

while the effective transconductance $g'_m$ is provided in the following Equation (2):

$$g'_m = \frac{g_m}{1 + g_m \cdot Z_s}$$

Referring again to FIG. 4, the effective -R element 512 of the TG-Stage 401 uses the transistors 430 and 431 in addition to the transistors 440 and 441 to maximize the "-R" effects and response speed of the circuit.

As previously noted, the differential input voltage of the TG-Stage 401 is $V_{in}=V_{inp}-V_{inm}$, while the differential output current of the TG-Stage 401 is $I_{o1}=i_1-i_2$, in which $i_1$ and $i_2$ are the differential currents ($i_2=-i_1$) output from the TG-Stage 401 at the differential output nodes $V_1$ and $V_2$, respectively.

As a result, the transfer function of the TG-Stage 401 may be represented by the following Equation (3):

$$\frac{I_{o1}}{V_{in}} = \frac{g_{m1}\left(1 - s\left(\frac{L_1}{R_{net}}\right)\right)}{1 + sL_1\left(g_{m1} - \frac{1}{R_{net}}\right)} = K_1\frac{(1 - s\tau_1)}{(1 + s\tau_2)}$$

Within Equation (3), $\tau_1$ represents the value of $L_1/R_{net}$, while $\tau_2$ represents the value of $L_1(g_{m1}-(1/R_{net}))$. The inductance value $L_1$ is a nominal inductance value provided by each of the inductor circuits 407, 408. The transconductance value $g_{m1}$ is provided by the transistor 420, or 421. The gain value $K_1$ is the DC gain equal to the transconductance value $g_{m1}$.

The resistance network value $R_{net}$ is provided by the following Equation (4):

$$-R_{net} = \frac{-R_x \cdot R_s}{R_s - R_x}$$

The $-R_x$ is the negative resistance from the cross coupled circuit, and is equal to $-1/g_{mx}$, where $g_{mx}$ is the transconductance of either of the transistors 440 or 441. Since the value of $R_s$ can be updated by a control signal received from the digital control logic 122, as previously described herein, the effective value of $R_{net}$ can be tuned accordingly; and thus, in turn, the time constants $\tau_1$ and $\tau_2$ can be modified to thereby adjust the time delay in each of the delay cells 201. The time delay for each of the delay cells 201 can be determined to be a desired value through adjustment of the $R_s$ value utilizing any suitable means, such as by completing a loop of the delay cells 201 (e.g., through the use of a switching element) to measure the ring frequency of the chain 210 of delay cells 201 to ensure that it lies within a threshold value so as to implement the desired delay within each of the delays cells.

The transfer function of the TZ-Stage 402 is provided by the following Equation (5):

$$\frac{V_{out}}{I_{o1}} = R_f - \frac{1}{g'_{m2t}} = R_f - \frac{1}{g_{m2t}} - sL_2$$

$R_f$ is the value of either of the feedback resistors $Rf_1$ or $Rf_2$. $sL_2$ is the impedance of the inductor circuit 416, or 417. The conductance $g_{ma}$ is the total composite transconductance of the combination of the transistors 450 and 460, or the transistors 451 and 461.

The DC gain, $K_{DC}$, of the TZ-Stage 402 may be considered to be represented by the following Equation (6):

$$R_f - (1/g_{m2t})$$

If the delay time contributed by the TZ-Stage 402 is represented by the value $\tau_3$, then it is equivalent to the following Equation (7):

$$L/(R_f - (1/g_{m2t}))$$

The result is that the transfer function of the TZ-Stage 402 can be represented by the following Equation (8):

$$K_{DC}(1-s\tau_3)$$

With first order approximations, the overall transfer function of each of the delay cells 201 (without loading) may be represented by the following Equation (9):

$$\frac{V_{out}}{V_{in}} = \frac{g_{m1}\left(1-s\left(\frac{L_1}{R_{net}}\right)\right)\left(R_f - \frac{1}{g_{mt}} - sL_2\right)}{1+sL_1\left(g_{m1}-\frac{1}{R_{net}}\right)} = K\frac{(1-s\tau_1)(1-s\tau_3)}{(1+s\tau_2)}$$

In this equation, $K=K_1*K_{DC}$. Recall that in the previously described transfer function of the TG-Stage 401 (see Equation (3)), the RHP zero is provided by $(1-s\tau_1)$, and the LHP pole is provided by $(1+s\tau_2)$. From Equation (8), it can be seen that the TZ-Stage 402 provides an additional RHP zero, generating a further phase shift, and thus an increase in the time delay for the delay cell 201.

The overall transfer function of each of the delay cells 201 (with loading) can then be represented by the following Equation (10):

$$\frac{V_{out}}{V_{in}} = K'\frac{(1-s\tau_1)(1-s\tau_3)}{(1+s\tau_2)(f(s))}$$

Referring to FIG. 6, each of the inductor circuits 407-408 and 414-417 may be implemented in the aforementioned inductorless configuration utilizing the circuit 600. The circuit 600 uses an active device 601 (e.g., an NMOS transistor) to present equivalent inductive circuit properties, which significantly requires less area to implement in a semiconductor integrated circuit than a prior art passive inductor. A first resistor 602 is coupled between a node 604 and the gate electrode of the transistor 601, which is coupled between the node 604 and a supply voltage (e.g., Vdd or Vss). A second resistor 603, with a resistance value larger than the first resistor 602, is coupled between the node 604 and a tunable DC bias voltage $V_{bs}$. The second resistor 603 is configured to block the AC signal at the node 604. As an example, the magnitude of the resistor 603 may be set to be 10 times as large compared to the resistor 602 to maintain the high frequency performance of the inductive elements. However, the resistor 603 may be made sufficiently small and comparable to the resistor 602 to reduce the inductance behaviors.

Figure 7:
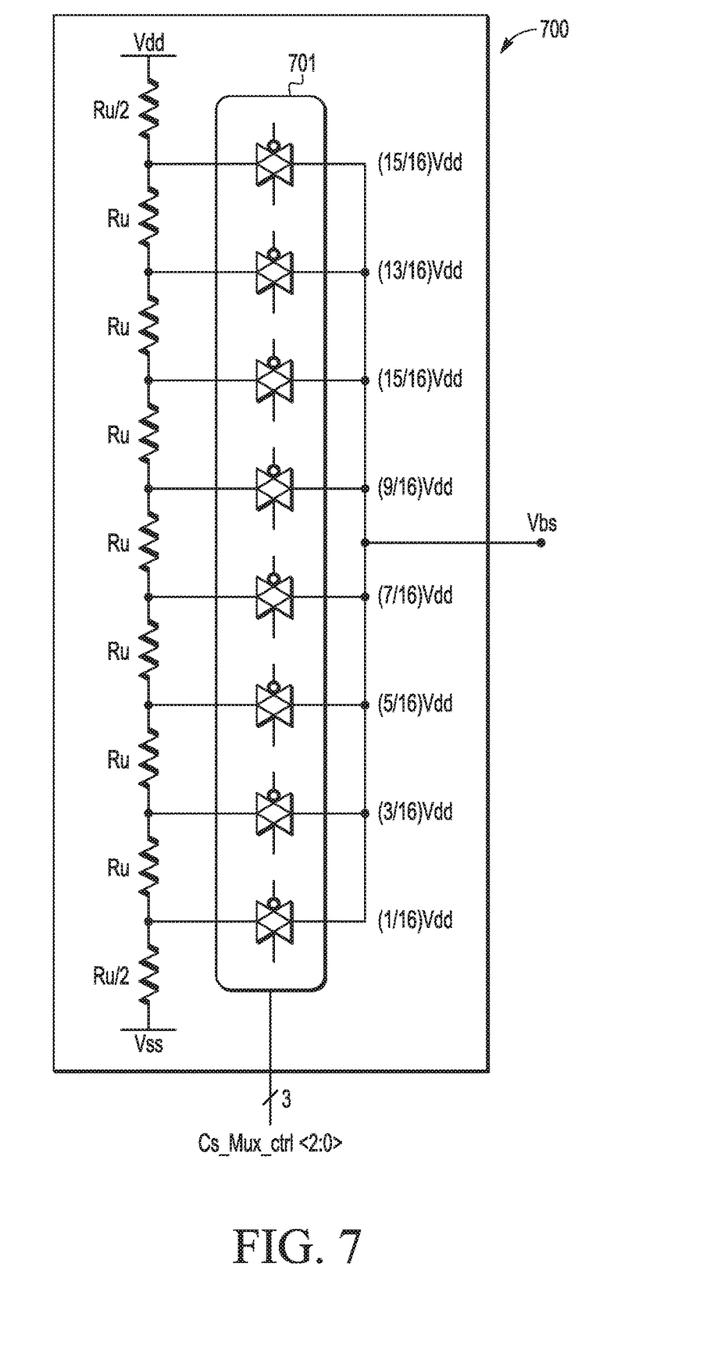
FIG. 7 illustrates a circuit diagram for implementing a variable voltage within the circuit of FIG. 6.

Control of the inductance value for the circuit 600 may be provided by tuning of the DC bias voltage $V_{bs}$. Referring to FIG. 7, the circuit 700 may be implemented for generating such a tunable DC bias voltage $V_{bs}$. The circuit 700 is shown as an example of such an implementation, though other equivalent configurations are within the scope of embodiments of the present invention. The exemplary circuit 700 utilizes a plurality of resistors with resistance values Ru and Ru/2 as shown coupled in series between a pair of voltage supplies (e.g., Vdd, Vss). A plurality of transmission gates 701 operate as switches for switching between operation as a short or an open circuit. As an example, depending upon which of the switches 701 are activated, $V_{bs}$ can take on a value that is a fraction of the voltage Vdd (e.g., ($\frac{1}{16}$)Vdd . . . ($\frac{15}{16}$)Vdd). Control of the operation of the switches 701 may be provided by an N-bit (e.g., N=3) signal Cs_Mux_ctrl received over a digital control logics 122 in the receiver 100 (see FIG. 1).

Figure 8:
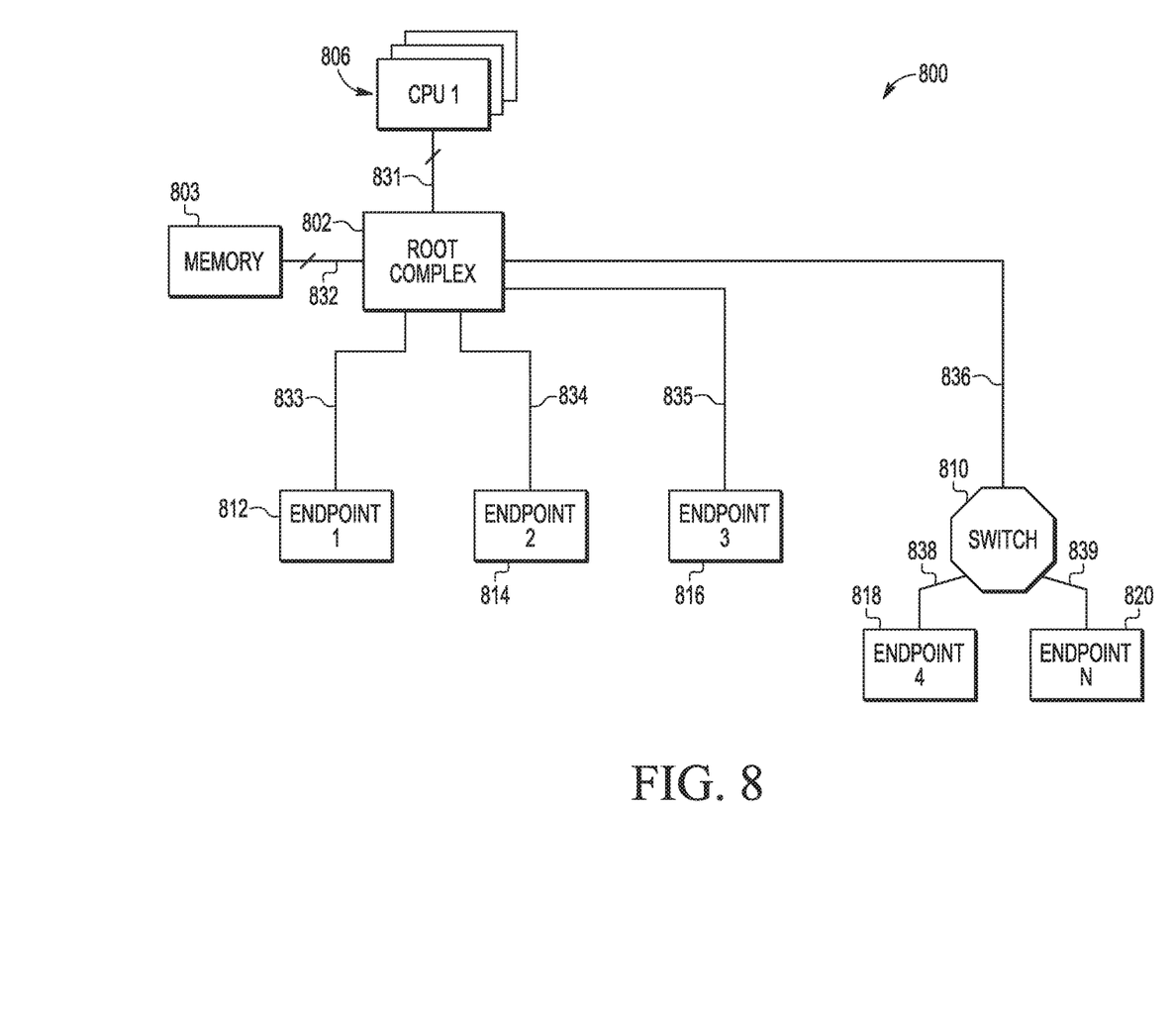
FIG. 8 illustrates a data processing system configured in accordance with embodiments of the present invention.

FIG. 8 illustrates an example of how a data processing system 800 may utilize a communications system as previously described with respect to FIG. 1, configured in accordance with embodiments of the present invention. The serial communications channels 102, 110 may be implemented as a Peripheral Component Interconnect-Express (herein referred to as "PCI Express" or "PCIe") bus to interconnect peripheral devices (e.g., the PCI Express endpoint devices discussed hereinafter) in applications, such as computing and communications platforms. A system employing a PCI Express architecture supports chip-to-chip interconnect and board-to-board interconnect via cards and connectors. More specifically, a PCI Express architecture implements one or more serial, point-to-point type interconnects for communications between two devices. Additionally, multiple PCI Express devices can be connected using switches that fan out the buses, making it possible to connect a large number of devices together in a system.

In the exemplary embodiment illustrated in FIG. 8, one or more processors (labeled as "CPU 1" in FIG. 8) 806 are coupled to a PCI Express root complex 802 by a local bus 831, or any other equivalent bus architecture. Likewise, a memory subsystem (labeled as "Memory") 803 is coupled to the PCI Express root complex 802 by a local bus 832, which may be part of the local bus 831. The data processing system 800 may implement one or more endpoint devices for coupling through the PCI Express root complex 802 to the processor(s) 806 and memory subsystem 803. One or more of the endpoint devices are PCI Express endpoint devices. One or more of the endpoint devices may include legacy PCI devices coupled to the root complex 802 by a PCIe-to-PCI bridge device (not shown).

This exemplary network configuration shows a hierarchy comprising N endpoint devices 812 . . . 820 (where N is greater than or equal to 1). A first endpoint device (labeled as "Endpoint 1") 812 is coupled to a first port on the PCI Express root complex 802 via a Link 833. In the exemplary data processing system 800 illustrated in FIG. 8, a second endpoint device (labeled as "Endpoint 2") 814 is coupled to the PCI Express root complex 802 by the Link 834. Similarly, a third endpoint device (labeled as "Endpoint 3") 816 is coupled to the PCI Express root complex 802 via the Link 835.

To illustrate how embodiments of the present invention may couple multiple endpoints in a hierarchy to a root complex via a switching device, the exemplary data processing system 800 of FIG. 8 further couples a fourth endpoint device (labeled as "Endpoint 4") 818 to the PCI Express root complex 802 via a Link 836, a PCI Express switching device (labeled as "Switch") 810, and a Link 838. Likewise, an Nth endpoint device (labeled as "Endpoint N") 820 is shown coupled to the PCI Express root complex 802 via the Link 836, the switching device 810, and a Link 839. The fourth multiplexer 828 is labeled as MUX N to indicate that there could be N (where N is greater than or equal to 1) multiplexers coupling a plurality of N endpoint devices or switching devices to the PCI Express root complex 802.

Reference is made herein to a device, circuit, or circuitry "configured" to perform a function or act. It should be understood that this may include selecting predefined logic blocks and logically associating them, such that they provide particular logic functions, which includes monitoring or control functions. It may also include programming computer software-based logic of a control device, wiring discrete hardware components, or a combination of any or all of the foregoing.

Aspects of the present disclosure provide a delay cell comprising a transconductance stage configured to convert a differential input voltage signal to a differential output current signal, wherein the transconductance stage comprises a differential pair of first and second transistors coupled in a source degeneration configuration, a negative resistance network coupled in parallel with a tunable resistor network, and shunt inductive circuitry coupled in parallel with the negative resistance network. The delay cell may further comprise a transimpedance stage configured to convert the differential output current signal received from the transconductance stage to a differential output voltage signal, wherein the transimpedance stage comprises a first transimpedance amplifier coupled in series with a first shunt inductive circuit. The transimpedance stage may further comprise a second transimpedance amplifier coupled in series with a second shunt inductive circuit, wherein the first transimpedance amplifier comprises an N-type feedback amplifier, and wherein the second transimpedance amplifier comprises a P-type feedback amplifier, and wherein the first and second shunt inductive circuits each comprise a current source coupled in parallel with an inductor circuit. The shunt inductive circuitry may comprise a current source coupled in parallel with an inductor circuit. The inductor circuit may be inductorless. The inductor circuit may comprise a transistor, a first resistor coupled between a gate electrode and another electrode of the transistor, and a second resistor coupled between the gate electrode and a tunable bias voltage. The negative resistance network may comprise first and second transistors with their gate electrodes configured to receive the differential input voltage signal, and cross-coupled third and fourth transistors with their gate electrodes connected to the shunt inductive circuitry, wherein a source electrode of the first transistor is connected to a drain electrode of the third transistor, and wherein a source electrode of the fourth electrode is connected to a drain electrode of the fourth electrode. The tunable resistor network may be connected between the gate electrodes of the cross-coupled third and fourth transistors, wherein the tunable resistor network is configured with a variable effective resistance. The transconductance stage may be configured with a first transfer function that generates an all pass response on the differential input voltage signal with a right half plane zero and a left hand plane pole, wherein the transimpedance stage is configured with a second transfer function with another right half plane zero.

Aspects of the present disclosure provide a communications receiver equalizer comprising a first delay cell configured to receive a first voltage signal and output a second voltage signal delayed in time with respect to the first voltage signal, a second delay cell configured to receive the second voltage signal and output a third voltage signal delayed in time with respect to the second voltage signal, a first tap multiplier configured to multiply the second voltage signal by a first equalization coefficient for output as a multiplied second voltage signal, a second tap multiplier configured to multiply the third voltage signal by a second equalization coefficient for output as a multiplied third voltage signal, and a summation circuit configured to sum the multiplied second voltage signal with the multiplied third voltage signal to produce an equalized output signal. The first and second delay cells may each comprise a transconductance stage configured to convert the first voltage signal to an output current signal, wherein the transconductance stage comprises a pair of first and second transistors coupled in a source degeneration configuration, a negative resistance network coupled in parallel with a tunable resistor network, shunt inductive circuitry coupled in parallel with the negative resistance network, and a transimpedance stage configured to convert the output current signal received from the transconductance stage to an output voltage signal, wherein the transimpedance stage comprises a first transimpedance amplifier coupled in series with a first shunt inductive circuit. The transimpedance stage may further comprise a second transimpedance amplifier coupled in series with a second shunt inductive circuit, wherein the first transimpedance amplifier comprises an N-type feedback amplifier, and wherein the second transimpedance amplifier comprises a P-type feedback amplifier, and wherein the first and second shunt inductive circuits each comprise a current source coupled in parallel with an inductor circuit. The shunt inductive circuitry may further comprise a current source coupled in parallel with an inductor circuit. The inductor circuit may further comprise a transistor, a first resistor coupled between a gate electrode and another electrode of the transistor, and a second resistor coupled between the gate electrode and a tunable bias voltage. The negative resistance network may further comprise first and second transistors with their gate electrodes configured to receive the first voltage signal, and cross-coupled third and fourth transistors with their gate electrodes connected to the shunt inductive circuitry, wherein a source electrode of the first transistor is connected to a drain electrode of the third transistor, wherein a source electrode of the fourth electrode is connected to a drain electrode of the fourth electrode, wherein the tunable resistor network is connected between the gate electrodes of the cross-coupled third and fourth transistors, and wherein the tunable resistor network is configured with a variable effective resistance. The transconductance stage may be configured with a first transfer function that generates an all pass response on the first voltage signal with a right half plane zero and a left hand plane pole, wherein the transimpedance stage is configured with a second transfer function with another right half plane zero. The communications receiver equalizer may further comprise a pre-filter linear equalizer configured to (1) receive a transmitted signal with inherent inter-symbol interference characteristics and (2) output the first voltage signal; and a decision feedback equalizer and finite-impulse response filter configured to receive the equalized output signal. The communications receiver equalizer may further comprise a third tap multiplier configured to multiply the first voltage signal by a third equalization coefficient for output as a multiplied first voltage signal, wherein the summation circuit is further configured to sum the multiplied first voltage signal with the multiplied first and second voltage signals to produce the equalized output signal.

Aspects of the present disclosure provide a data processing system comprising a processor, a memory subsystem coupled to the processor, and a peripheral device coupled to the processor via a serial communications channel. The peripheral device may further comprise a communications receiver equalizer comprising a first delay cell configured to receive a first voltage signal from the serial communications channel and output a second voltage signal delayed in time with respect to the first voltage signal, a second delay cell configured to receive the second voltage signal and output a third voltage signal delayed in time with respect to the second voltage signal, a first tap multiplier configured to multiply the second voltage signal by a first equalization coefficient for output as a multiplied second voltage signal, a second tap multiplier configured to multiply the third voltage signal by a second equalization coefficient for output as a multiplied third voltage signal, and a summation circuit configured to sum the multiplied second voltage signal with the multiplied third voltage signal to produce an equalized output signal, wherein the equalized output signal is an equalized version of the first voltage signal. Each of the first and second delay cells may each comprise a transconductance stage configured to convert the first voltage signal to an output current signal, wherein the transconductance stage comprises a differential pair of first and second transistors coupled in a source degeneration configuration, a negative resistance network coupled in parallel with a tunable resistor network, and shunt inductive circuitry coupled in parallel with the negative resistance network. Each of the first and second delay cells may further each comprise a transimpedance stage configured to convert the output current signal received from the transconductance stage to an output voltage signal, wherein the transimpedance stage comprises a first transimpedance amplifier coupled in series with a first shunt inductive circuit. The transimpedance stage may further comprise a second transimpedance amplifier coupled in series with a second shunt inductive circuit, wherein the first transimpedance amplifier comprises an N-type feedback amplifier, and wherein the second transimpedance amplifier comprises a P-type feedback amplifier, and wherein the first and second shunt inductive circuits each comprise a current source coupled in parallel with an inductor circuit, wherein the shunt inductive circuitry comprises a current source coupled in parallel with an inductor circuit. The inductor circuit may further comprise a transistor, a first resistor coupled between a gate electrode and another electrode of the transistor, and a second resistor coupled between the gate electrode and a tunable bias voltage. The negative resistance network may further comprise first and second transistors with their gate electrodes configured to receive the first voltage signal, and cross-coupled third and fourth transistors with their gate electrodes connected to the shunt inductive circuitry, wherein a source electrode of the first transistor is connected to a drain electrode of the third transistor, and wherein a source electrode of the fourth electrode is connected to a drain electrode of the fourth electrode, wherein the tunable resistor network is connected between the gate electrodes of the cross-coupled third and fourth transistors, and wherein the tunable resistor network is configured with a variable effective resistance.

Reference throughout this specification to "an embodiment," "embodiments," "further embodiments," or similar language means that a particular feature, structure, or characteristic described in connection with the embodiments is included in at least one embodiment of the present invention. Thus, appearances of the phrases "in one embodiment," "in an embodiment," "embodiments," and similar language throughout this specification may, but do not necessarily, all refer to the same embodiment. Furthermore, the described features, structures, aspects, or characteristics of embodiments of the invention may be combined in any suitable manner in one or more embodiments. Correspondingly, even if features may be initially claimed as acting in certain combinations, one or more features from a claimed combination can in some cases be excised from the combination, and the claimed combination can be directed to a subcombination or variation of a sub-combination.

In the descriptions herein, numerous specific details are provided, such as examples of communications channels, serial links, etc., to provide a thorough understanding of embodiments of the invention. One skilled in the relevant art will recognize, however, that aspects of the invention may be practiced without one or more of the specific details, or with other methods, components, materials, and so forth. In other instances, well-known structures, materials, or operations may be not shown or described in detail to avoid obscuring aspects of the invention.

Benefits, advantages, and solutions to problems have been described above with regard to specific embodiments. However, the benefits, advantages, and solutions to problems, and any element(s) that may cause any benefit, advantage, or solution to occur or become more pronounced may be not to be construed as critical, required, or essential features or elements of any or all the claims.

Those skilled in the art having read this disclosure will recognize that changes and modifications may be made to the embodiments without departing from the scope of the present invention. It should be appreciated that the particular implementations shown and described herein may be illustrative of the invention and may be not intended to otherwise limit the scope of the present invention in any way. Other variations to the embodiments of the present invention disclosed herein may be within the scope of the following claims.

While this specification contains many specifics, these should not be construed as limitations on the scope of the invention or of what can be claimed, but rather as descriptions of features specific to particular implementations of the invention. Headings herein may be not intended to limit the invention, embodiments of the invention, or other matter disclosed under the headings.

As used herein, the terms "comprises," "comprising," "includes," or any other variation thereof, may be intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as essential or critical.

Herein, the term "or" may be intended to be inclusive, wherein "A or B" includes A or B and also includes both A and B.

The terminology used herein is for the purpose of describing particular embodiments only and is not intended to be limiting of the invention. As used herein, the singular forms "a," "an," and "the" may be intended to include the plural forms as well, unless the context clearly indicates otherwise. It will be further understood that the terms "comprises" or "comprising," when used in this specification, which may include the claims herein below, specify the presence of stated features, integers, steps, operations, elements, or components, but do not preclude the presence or addition of one or more other features, integers, steps, operations, elements, components, or groups thereof.

The corresponding structures, materials, acts, and equivalents of all means or step plus function elements in the claims below may be intended to include any structure, material, or act for performing the function in combination with other claimed elements as specifically claimed.

What is claimed is:

1. A delay cell comprising:
    a transconductance stage configured to convert a differential input voltage signal to a differential output current signal, wherein the transconductance stage comprises:
        a differential pair of first and second transistors coupled in a source degeneration configuration;

a negative resistance network coupled in parallel with a tunable resistor network; and shunt inductive circuitry coupled in parallel with the negative resistance network.

2. The delay cell as recited in claim 1, further comprising a transimpedance stage configured to convert the differential output current signal received from the transconductance stage to a differential output voltage signal, wherein the transimpedance stage comprises a first transimpedance amplifier coupled in series with a first shunt inductive circuit.

3. The delay cell as recited in claim 2, wherein the transimpedance stage further comprises a second transimpedance amplifier coupled in series with a second shunt inductive circuit, wherein the first transimpedance amplifier comprises an N-type feedback amplifier, and wherein the second transimpedance amplifier comprises a P-type feedback amplifier, and wherein the first and second shunt inductive circuits each comprise a current source coupled in parallel with an inductor circuit.

4. The delay cell as recited in claim 1, wherein the shunt inductive circuitry comprises a current source coupled in parallel with an inductor circuit.

5. The delay cell as recited in claim 4, wherein the inductor circuit is inductorless.

6. The delay cell as recited in claim 4, wherein the inductor circuit comprises:
a transistor;
a first resistor coupled between a gate electrode and another electrode of the transistor; and
a second resistor coupled between the gate electrode and a tunable bias voltage.

7. The delay cell as recited in claim 1, wherein the negative resistance network comprises:
first and second transistors with their gate electrodes configured to receive the differential input voltage signal; and
cross-coupled third and fourth transistors with their gate electrodes connected to the shunt inductive circuitry, wherein a source electrode of the first transistor is connected to a drain electrode of the third transistor, and wherein a source electrode of the fourth electrode is connected to a drain electrode of the fourth electrode.

8. The delay cell as recited in claim 7, wherein the tunable resistor network is connected between the gate electrodes of the cross-coupled third and fourth transistors, wherein the tunable resistor network is configured with a variable effective resistance.

9. The delay cell as recited in claim 2, wherein the transconductance stage is configured with a first transfer function that generates an all pass response on the differential input voltage signal with a right half plane zero and a left hand plane pole, wherein the transimpedance stage is configured with a second transfer function with another right half plane zero.

10. A communications receiver equalizer comprising:
a first delay cell configured to receive a first voltage signal and output a second voltage signal delayed in time with respect to the first voltage signal;
a second delay cell configured to receive the second voltage signal and output a third voltage signal delayed in time with respect to the second voltage signal;
a first tap multiplier configured to multiply the second voltage signal by a first equalization coefficient for output as a multiplied second voltage signal;
a second tap multiplier configured to multiply the third voltage signal by a second equalization coefficient for output as a multiplied third voltage signal; and
a summation circuit configured to sum the multiplied second voltage signal with the multiplied third voltage signal to produce an equalized output signal,
wherein the first and second delay cells each comprise:
a transconductance stage configured to convert the first voltage signal to an output current signal, wherein the transconductance stage comprises:
a pair of first and second transistors coupled in a source degeneration configuration;
a negative resistance network coupled in parallel with a tunable resistor network; and
shunt inductive circuitry coupled in parallel with the negative resistance network; and
a transimpedance stage configured to convert the output current signal received from the transconductance stage to an output voltage signal, wherein the transimpedance stage comprises a first transimpedance amplifier coupled in series with a first shunt inductive circuit.

11. The communications receiver equalizer as recited in claim 10, wherein the transimpedance stage further comprises a second transimpedance amplifier coupled in series with a second shunt inductive circuit, wherein the first transimpedance amplifier comprises an N-type feedback amplifier, and wherein the second transimpedance amplifier comprises a P-type feedback amplifier, and wherein the first and second shunt inductive circuits each comprise a current source coupled in parallel with an inductor circuit.

12. The communications receiver equalizer as recited in claim 10, wherein the shunt inductive circuitry comprises a current source coupled in parallel with an inductor circuit.

13. The communications receiver equalizer as recited in claim 12, wherein the inductor circuit comprises:
a transistor;
a first resistor coupled between a gate electrode and another electrode of the transistor; and
a second resistor coupled between the gate electrode and a tunable bias voltage.

14. The communications receiver equalizer as recited in claim 10, wherein the negative resistance network comprises:
first and second transistors with their gate electrodes configured to receive the first voltage signal; and
cross-coupled third and fourth transistors with their gate electrodes connected to the shunt inductive circuitry, wherein a source electrode of the first transistor is connected to a drain electrode of the third transistor, and wherein a source electrode of the fourth electrode is connected to a drain electrode of the fourth electrode,
wherein the tunable resistor network is connected between the gate electrodes of the cross-coupled third and fourth transistors, and wherein the tunable resistor network is configured with a variable effective resistance.

15. The communications receiver equalizer as recited in claim 10, wherein the transconductance stage is configured with a first transfer function that generates an all pass response on the first voltage signal with a right half plane zero and a left hand plane pole, wherein the transimpedance stage is configured with a second transfer function with another right half plane zero.

16. The communications receiver equalizer as recited in claim 10, further comprising:

a pre-filter linear equalizer configured to (1) receive a transmitted signal with inherent inter-symbol interference characteristics and (2) output the first voltage signal; and a decision feedback equalizer and finite-impulse response filter configured to receive the equalized output signal.

17. The communications receiver equalizer as recited in claim 10, further comprising a third tap multiplier configured to multiply the first voltage signal by a third equalization coefficient for output as a multiplied first voltage signal, wherein the summation circuit is further configured to sum the multiplied first voltage signal with the multiplied first and second voltage signals to produce the equalized output signal.

18. A data processing system comprising:

a processor;

a memory subsystem coupled to the processor; and a peripheral device coupled to the processor via a serial communications channel, wherein the peripheral device further comprises a communications receiver equalizer comprising:

a first delay cell configured to receive a first voltage signal from the serial communications channel and output a second voltage signal delayed in time with respect to the first voltage signal;

a second delay cell configured to receive the second voltage signal and output a third voltage signal delayed in time with respect to the second voltage signal;

a first tap multiplier configured to multiply the second voltage signal by a first equalization coefficient for output as a multiplied second voltage signal;

a second tap multiplier configured to multiply the third voltage signal by a second equalization coefficient for output as a multiplied third voltage signal; and a summation circuit configured to sum the multiplied second voltage signal with the multiplied third voltage signal to produce an equalized output signal, wherein the equalized output signal is an equalized version of the first voltage signal, wherein the first and second delay cells each comprise:

a transconductance stage configured to convert the first voltage signal to an output current signal, wherein the transconductance stage comprises:

a differential pair of first and second transistors coupled in a source degeneration configuration;

a negative resistance network coupled in parallel with a tunable resistor network; and shunt inductive circuitry coupled in parallel with the negative resistance network; and a transimpedance stage configured to convert the output current signal received from the transconductance stage to an output voltage signal, wherein the transimpedance stage comprises a first transimpedance amplifier coupled in series with a first shunt inductive circuit.

19. The data processing system as recited in claim 18, wherein the transimpedance stage further comprises a second transimpedance amplifier coupled in series with a second shunt inductive circuit, wherein the first transimpedance amplifier comprises an N-type feedback amplifier, and wherein the second transimpedance amplifier comprises a P-type feedback amplifier, and wherein the first and second shunt inductive circuits each comprise a current source coupled in parallel with an inductor circuit, wherein the shunt inductive circuitry comprises a current source coupled in parallel with an inductor circuit, wherein the inductor circuit comprises:

a transistor;

a first resistor coupled between a gate electrode and another electrode of the transistor; and a second resistor coupled between the gate electrode and a tunable bias voltage.

20. The data processing system as recited in claim 19, wherein the negative resistance network comprises:

first and second transistors with their gate electrodes configured to receive the first voltage signal; and cross-coupled third and fourth transistors with their gate electrodes connected to the shunt inductive circuitry, wherein a source electrode of the first transistor is connected to a drain electrode of the third transistor, and wherein a source electrode of the fourth electrode is connected to a drain electrode of the fourth electrode, wherein the tunable resistor network is connected between the gate electrodes of the cross-coupled third and fourth transistors, and wherein the tunable resistor network is configured with a variable effective resistance.

\* \* \* \* \*